United States Patent
Gosselin

(10) Patent No.: US 9,017,513 B2
(45) Date of Patent: Apr. 28, 2015

(54) PLASMA MONITORING PROBE ASSEMBLY AND PROCESSING CHAMBER INCORPORATING THE SAME

(71) Applicant: Lam Research Corporation, Fremont, CA (US)

(72) Inventor: Simon Gosselin, San Mateo, CA (US)

(73) Assignee: Lam Research Corporation, Fremont, CA (US)

( * ) Notice: Subject to any disclaimer, the term of this patent is extended or adjusted under 35 U.S.C. 154(b) by 50 days.

(21) Appl. No.: 13/671,072

(22) Filed: Nov. 7, 2012

(65) Prior Publication Data
US 2014/0124138 A1    May 8, 2014

(51) Int. Cl.
*H01J 37/32*    (2006.01)

(52) U.S. Cl.
CPC ..... *H01J 37/32917* (2013.01); *H01J 37/32935* (2013.01)

(58) Field of Classification Search
CPC ............. H01J 37/32917; H01J 37/32935; H01J 37/32944; H01J 37/32954; H01J 37/32963; H01J 37/32972; H01J 37/32981
USPC ............ 156/345.24, 345.25, 345.28; 118/712
See application file for complete search history.

(56) References Cited

U.S. PATENT DOCUMENTS

| | | | |
|---|---|---|---|
| 5,344,536 A | 9/1994 | Obuchi et al. | |
| 5,665,166 A * | 9/1997 | Deguchi et al. | 118/723 E |
| 5,933,314 A | 8/1999 | Lambson et al. | |
| 6,063,234 A | 5/2000 | Chen et al. | |
| 6,357,308 B1 | 3/2002 | Marsh et al. | |
| 6,464,843 B1 * | 10/2002 | Wicker et al. | 204/192.15 |
| 6,553,853 B2 | 4/2003 | Marsh et al. | |
| 6,653,852 B1 | 11/2003 | Benjamin | |

(Continued)

FOREIGN PATENT DOCUMENTS

KR    2001036711 A  *  5/2001

OTHER PUBLICATIONS

"Basics about Metals, Ceramics and Polymers." LeHigh University. Nov. 10, 2004.*

(Continued)

*Primary Examiner* — Jeffrie R Lund
*Assistant Examiner* — Yuechuan Yu

(57) ABSTRACT

A plasma processing chamber is provided comprising one or more process gas inlets, one or more exhaust gas outlets, plasma generating hardware configured to generate a process gas plasma in a plasma processing portion of the plasma processing chamber, a wafer processing stage positioned in the plasma processing chamber, and a plasma monitoring probe assembly. The plasma monitoring probe assembly comprises an electrically conductive probe and an insulator sleeve assembly positioned about the electrically conductive probe. The insulator sleeve assembly comprises a plasma-side sleeve portion and a subterranean sleeve portion positioned about distinct portions of a longitudinal probe axis of the electrically conductive probe of the probe assembly. The plasma-side sleeve portion of the insulator sleeve assembly is constructed of material that is more resistant to plasma-based degradation than is the material of the subterranean sleeve portion of the insulator sleeve assembly, while the subterranean sleeve portion of the insulator sleeve assembly is constructed of material that is more electrically resistant than the material of the plasma-side sleeve portion of the insulator sleeve assembly.

13 Claims, 4 Drawing Sheets

(56) References Cited

U.S. PATENT DOCUMENTS

| | | | |
|---|---|---|---|
| 6,714,033 B1 | 3/2004 | Makhratchev et al. | |
| 6,781,393 B2 | 8/2004 | Benjamin | |
| 6,833,710 B2 | 12/2004 | Benveniste | |
| 6,936,135 B2 | 8/2005 | Antolik | |
| 6,972,579 B2 | 12/2005 | Benjamin | |
| 7,080,941 B1 | 7/2006 | Benjamin et al. | |
| 7,211,170 B2 | 5/2007 | Antolik | |
| 7,319,316 B2 | 1/2008 | Kimball et al. | |
| 7,479,207 B2 | 1/2009 | Kimball et al. | |
| 7,572,737 B1* | 8/2009 | Dhindsa | 438/714 |
| 7,649,363 B2 | 1/2010 | Lemson | |
| 7,651,269 B2 | 1/2010 | Comendant | |
| 7,723,994 B2* | 5/2010 | Kimball et al. | 324/464 |
| 7,829,468 B2 | 11/2010 | Keil et al. | |
| 7,867,355 B2 | 1/2011 | Kimball et al. | |
| 7,869,184 B2 | 1/2011 | Steger | |
| 7,994,794 B2 | 8/2011 | Kimball et al. | |
| 8,022,718 B2 | 9/2011 | Avoyan et al. | |
| 8,043,470 B2 | 10/2011 | Hardin et al. | |
| 8,159,233 B2 | 4/2012 | Booth et al. | |
| 8,164,349 B2 | 4/2012 | Booth et al. | |
| 8,164,353 B2 | 4/2012 | Booth et al. | |
| 8,179,152 B2 | 5/2012 | Booth et al. | |
| 2003/0227283 A1* | 12/2003 | Cox et al. | 324/71.1 |
| 2004/0040931 A1* | 3/2004 | Koshiishi et al. | 216/67 |
| 2004/0113603 A1* | 6/2004 | Fink et al. | 324/72.5 |
| 2004/0149384 A1* | 8/2004 | Kanno et al. | 156/345.24 |
| 2007/0284246 A1* | 12/2007 | Keil et al. | 204/298.36 |
| 2008/0020574 A1 | 1/2008 | Marakhtanov et al. | |
| 2008/0138993 A1* | 6/2008 | Hiroshima et al. | 438/714 |
| 2008/0149596 A1 | 6/2008 | Dhindsa et al. | |
| 2009/0090695 A1* | 4/2009 | Kadkhodayan et al. | 216/67 |
| 2009/0200269 A1 | 8/2009 | Kadkhodayan et al. | |
| 2010/0007337 A1* | 1/2010 | Booth et al. | 324/149 |
| 2010/0040768 A1 | 2/2010 | Dhindsa | |
| 2011/0021031 A1* | 1/2011 | Taylor et al. | 438/724 |
| 2011/0022215 A1 | 1/2011 | Keil et al. | |
| 2012/0028379 A1 | 2/2012 | Dhindsa et al. | |

OTHER PUBLICATIONS

"Resistivity of Aluminum Oxide." Huang, Eunice. Nov. 7, 2006.*
"Teflon (Polytetratfluoroethylene)" Davidson University. Jan. 1, 2004.*
"Resistivity and Temperature Coefficient at 20C." GSU. Apr. 22, 2005.*
"Resistivty and Temperature Coefficient at 20C.". Ref. quartz. Hyperphysics.*
"Sapphire". www.mt-berlin.com.*

* cited by examiner

PLASMA MONITORING PROBE ASSEMBLY AND PROCESSING CHAMBER INCORPORATING THE SAME

BACKGROUND

Plasma processing systems are potentially subject to a variety of specific modes of failure. Many such modes are difficult to detect prior to processing an actual device wafer and can result in faulty wafer processing. Detection systems, hardware and methodology have been, and continue to be, developed to help monitor plasma characteristics and wafer processing in a plasma processing chamber. These capabilities can be used to diagnose processing problems and detect processing faults. The present disclosure relates to plasma processing systems and, more particularly, to enhancements in the self-diagnostic capabilities of such systems.

BRIEF SUMMARY

In accordance with one embodiment of the present disclosure, a plasma processing chamber is provided comprising one or more process gas inlets, one or more exhaust gas outlets, plasma generating hardware configured to generate a process gas plasma in a plasma processing portion of the plasma processing chamber, a wafer processing stage positioned in the plasma processing chamber, and a plasma monitoring probe assembly. The plasma monitoring probe assembly comprises an electrically conductive probe and an insulator sleeve assembly positioned about the electrically conductive probe. The electrically conductive probe and the insulator sleeve assembly of the plasma monitoring probe assembly are positioned in an operationally-graded E-field portion of the plasma processing chamber. The plasma-side sleeve portion of the insulator sleeve assembly is positioned along a portion of the longitudinal probe axis that is closer to the plasma processing portion of the plasma processing chamber than is the subterranean sleeve portion of the insulator sleeve assembly. The subterranean sleeve portion of the insulator sleeve assembly is positioned along a portion of the longitudinal probe axis that is closer to an E-field maximum of the operationally-graded E-field portion of the plasma processing chamber than is the plasma-side sleeve portion of the insulator sleeve assembly. The plasma-side sleeve portion of the insulator sleeve assembly is constructed of material that is more resistant to plasma-based degradation than is the material of the subterranean sleeve portion of the insulator sleeve assembly and the subterranean sleeve portion of the insulator sleeve assembly is constructed of material that is more electrically resistant than the material of the plasma-side sleeve portion of the insulator sleeve assembly.

In accordance with another embodiment of the present disclosure, a plasma processing chamber is provided comprising one or more process gas inlets, one or more exhaust gas outlets, plasma generating hardware configured to generate a process gas plasma in a plasma processing portion of the plasma processing chamber, a wafer processing stage positioned in the plasma processing chamber, and a plasma monitoring probe assembly. The plasma monitoring probe assembly comprises an electrically conductive probe and an insulator sleeve assembly positioned about the electrically conductive probe. The plasma processing chamber comprises one or more chamber components that are electrically isolated from the electrically conductive probe by the insulator sleeve assembly. The insulator sleeve assembly comprises a plasma-side sleeve portion and a subterranean sleeve portion positioned about distinct portions of a longitudinal probe axis of the electrically conductive probe of the probe assembly. The plasma-side sleeve portion of the insulator sleeve assembly is positioned along a portion of the longitudinal probe axis that is closer to the plasma processing portion of the plasma processing chamber than is the subterranean sleeve portion of the insulator sleeve assembly. The plasma-side sleeve portion of the insulator sleeve assembly is constructed of material that is more resistant to plasma-based degradation than is the material of the subterranean sleeve portion of the insulator sleeve assembly. The subterranean sleeve portion of the insulator sleeve assembly is constructed of material that is more electrically resistant than the material of the plasma-side sleeve portion of the insulator sleeve assembly.

In accordance with yet another embodiment of the present disclosure, a plasma monitoring probe assembly is provided comprising an electrically conductive probe and an insulator sleeve assembly positioned about the electrically conductive probe. The insulator sleeve assembly comprises a plasma-side sleeve portion and a subterranean sleeve portion positioned about distinct portions of a longitudinal probe axis of the electrically conductive probe of the probe assembly. The plasma-side sleeve portion of the insulator sleeve assembly is constructed of material that is more resistant to plasma-based degradation than is the material of the subterranean sleeve portion of the insulator sleeve assembly. The subterranean sleeve portion of the insulator sleeve assembly is constructed of material that is more electrically resistant than the material of the plasma-side sleeve portion of the insulator sleeve assembly.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
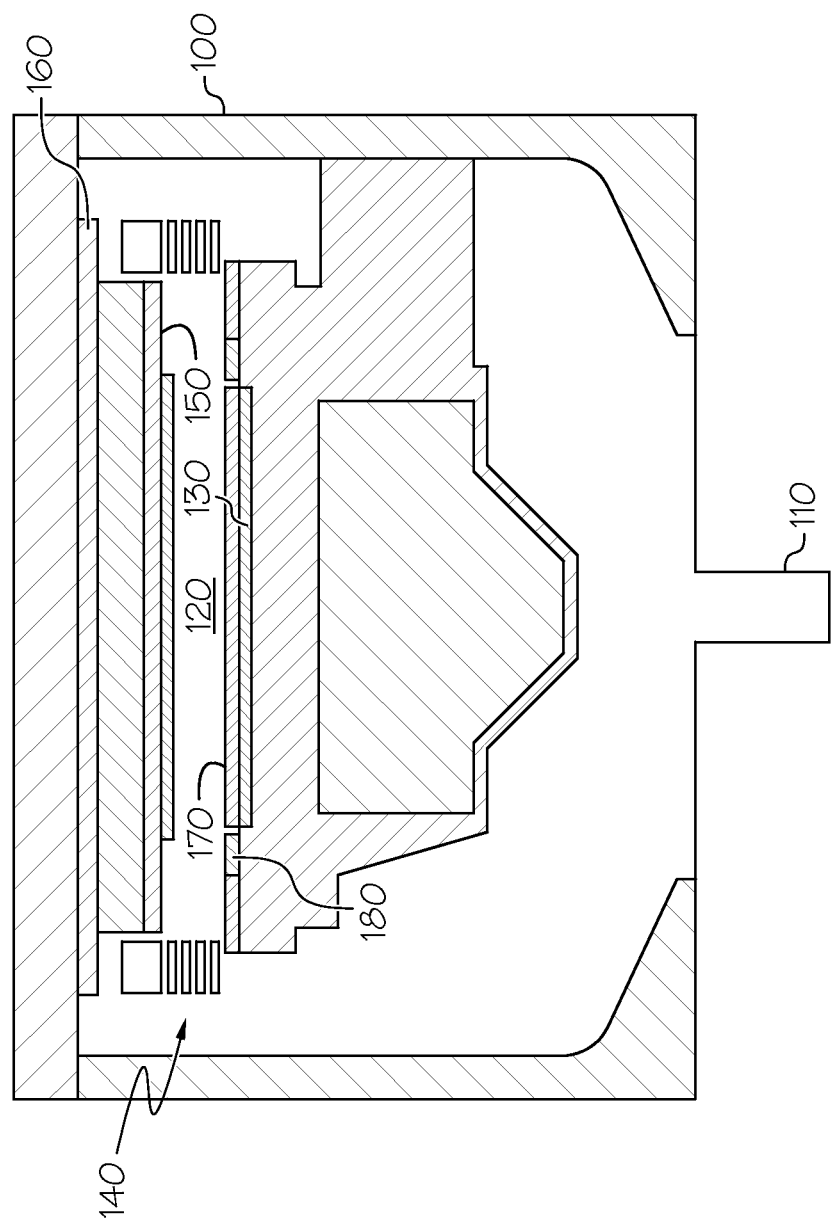
FIG. 1 illustrates the general configuration of a capacitively-coupled plasma processing chamber.

FIG. 1 illustrates the general configuration of a capacitively-coupled plasma processing chamber 1. The specific structural and operational details of the chamber 1 are beyond the scope of the present invention and may be gleaned from conventional and yet-to-be developed teachings in the art, including those found in US PG Pub. No. 2011/0022215. Generally, the illustrated plasma processing chamber 100 is a parallel plate plasma system such as the EXELAN® 2300 system available from Lam Research Corporation. The system includes a processing chamber 100 that is maintained at a desired vacuum pressure by a vacuum pump connected to an exhaust gas outlet 110. Etching gas is supplied to the plasma chamber reactor from a gas feed and a medium density plasma is generated in the plasma processing portion 120 of the chamber 100 by, for example, a dual frequency arrangement wherein RF energy from RF sources is supplied through a matching network to a powered lower electrode 130. Plasma confinement is assisted by confinement rings 140. An upper electrode 150 is grounded and is connected to a heated top plate 160. A wafer to be processed is clamped to a wafer processing stage 170 in the form of an electrostatic chuck, which is surrounded by an electrically conductive silicon edge ring 180.

Figure 2:
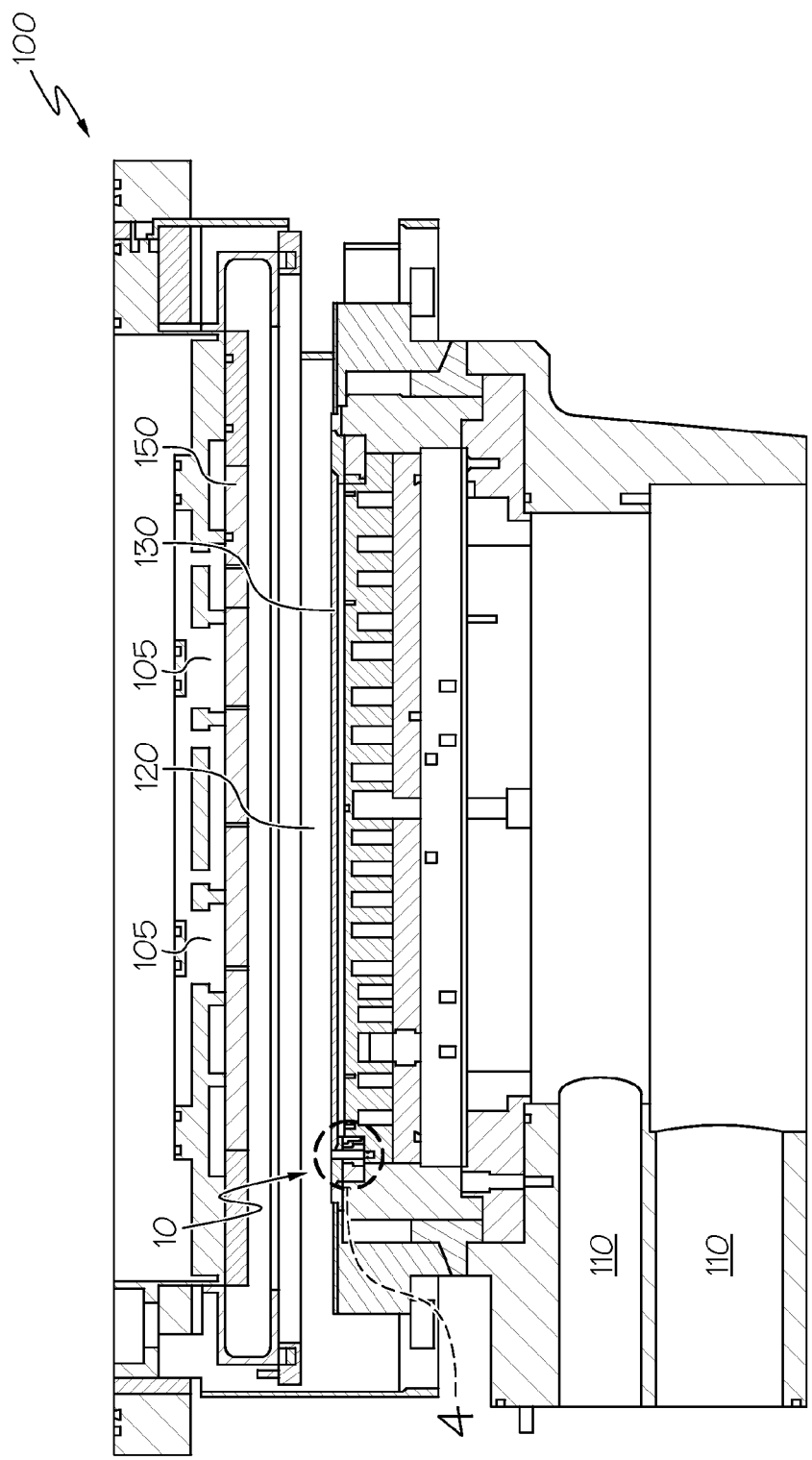
FIG. 2 illustrates the manner in which a plasma processing chamber may incorporate a plasma monitoring probe assembly according to the present disclosure.
Figure 3:
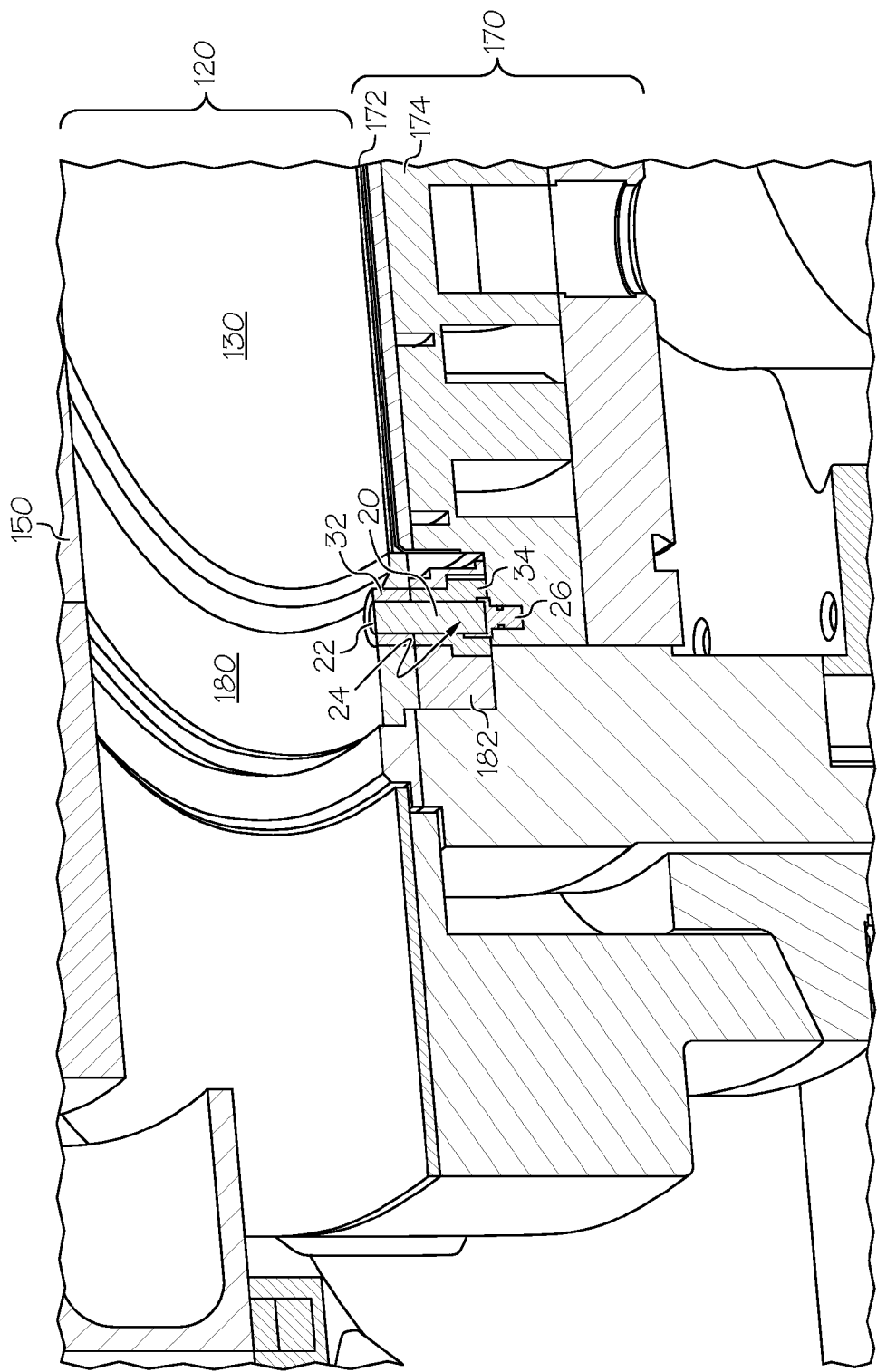
FIG. 3 presents a more detailed illustration of the manner in which the plasma processing chamber of FIG. 2 may incorporate a plasma monitoring probe assembly according to the present disclosure.
Figure 4:
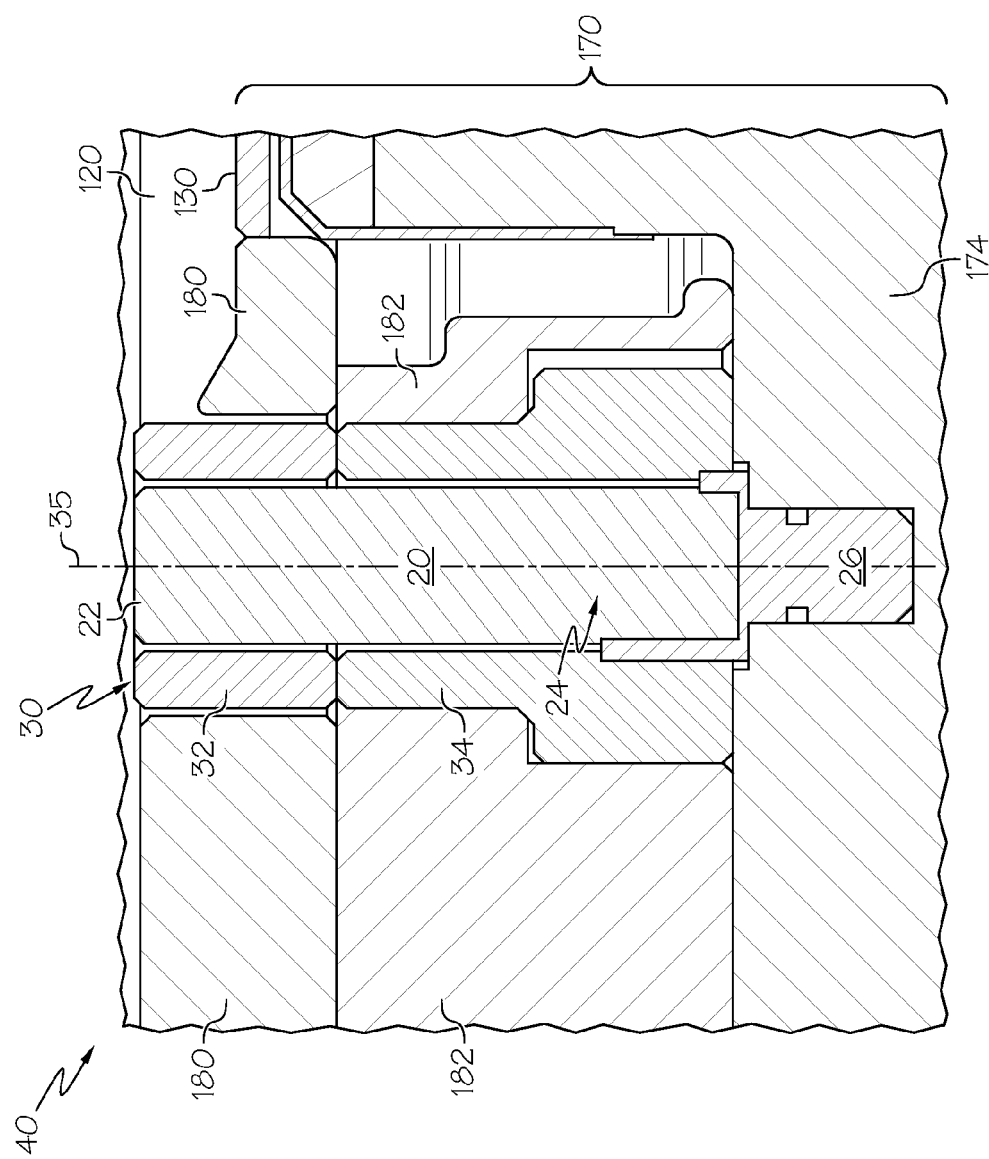
FIG. 4 is a closer view of the plasma monitoring probe assembly illustrated in FIG. 3.

FIG. 2-4 illustrate the manner in which a plasma processing chamber 100 may be configured to incorporate a plasma monitoring probe assembly 10 according to the present disclosure. Although the concepts of the present disclosure are described herein with specific reference to particular types of plasma processing systems, it is contemplated that the concepts will enjoy applicability to any plasma processing system where a plasma parameter probe would be useful in enhancing the self-diagnostic capabilities of the system. More specifically, although embodiments have been discussed in conjunction with capacitively-coupled plasma processing chambers, the concepts of the present disclosure are also applicable to inductively-coupled plasma processing chambers, electron cyclotron resonance (ECR) plasma processing chambers, etc., the design and operational parameters of which can be gleaned from existing patents and non-patent literature, and from yet-to-be developed teachings in the art.

Referring to FIGS. 2-4, the illustrated plasma processing chamber 100 comprises one or more process gas inlets 105, one or more exhaust gas outlets 110, and plasma generating hardware in the form of lower and upper electrodes 130, 150 that can be driven to generate a process gas plasma in a plasma processing portion 120 of the plasma processing chamber 100. Contemplated types of contemplated plasma generating hardware include, but are not limited to, capacitively coupled plasma generating hardware, inductively coupled plasma generating hardware, or electron cyclotron resonance plasma generating hardware. It is also contemplated that the plasma processing chamber 100 may further comprise respective process gas sources and inert gas sources coupled to the one or more process gas inlets 105. A wafer processing stage 170 is positioned in the plasma processing chamber 100. An electrically conductive silicon edge ring 180 surrounds a wafer mounting portion 172 of the wafer processing stage 170, which wafer mounting portion 172 is supported by an electrically conductive base 174 of the wafer processing stage 170. The electrically conductive silicon edge ring 180 is supported by an electrically insulating ceramic coupling ring 182.

The plasma processing chamber 100 further comprises a plasma monitoring probe assembly 10. As is illustrated in FIGS. 3 and 4, the plasma monitoring probe assembly 10 comprises an electrically conductive probe 20 and an insulator sleeve assembly 30 that is positioned about the electrically conductive probe 20. The electrically conductive probe 20 can be positioned such that a sensing surface 22 of the electrically conductive portion of the probe is exposed to plasma generated within the plasma processing portion 120 of the plasma processing chamber 100. The plasma processing chamber 100 can be provided with control hardware that is configured to control an electrical bias of the electrically conductive probe 20 relative to an electrically grounded, floating, or biased component of the plasma processing chamber 100. For example, the probe assembly 10 can be disposed within a plasma chamber wall or another component of the plasma chamber. Typically, such a component will comprise, for example, an RF biased, electrically floating, or grounded surface within the plasma chamber. The sensing surface 22 of the electrically conductive probe 20 can be exposed to the plasma in the vicinity of the probe assembly 10 to measure a plasma parameter within the processing chamber 100.

Generally, the plasma monitoring probe assembly 10 can be positioned anywhere in the plasma processing chamber 100 where it can be used to monitor a parameter of the plasma generated in the chamber 100. In the illustrated embodiment, the plasma monitoring probe assembly 10 is positioned in the electrically conductive silicon edge ring 180 and extends from the electrically conductive base 174, through the ceramic coupling ring 182, and the silicon edge ring 180.

In one embodiment, the plasma monitoring probe assembly 10 is a Planar Ion Flux (PIF) probe, as disclosed for example in Published US Patent Application No. 2011/0022215. A PIF probe can be presented in the form of a relatively large-area, planar Langmuir probe that is capacitively coupled to a pulsed RF source. During the application of an RF burst, a bias voltage is developed across a coupling capacitor. When the RF burst ends, the capacitor then provides a voltage sufficient to bias the collection surface so as to collect ions from the plasma. If the bias is sufficient to achieve a condition known as "ion saturation" the measured current collected during the "ion saturation" portion of the discharge phase divided by the area of the collection surface gives a measure of the ion flux. Furthermore, as the voltage across the biasing capacitor decays, the collected current will also decay. A plot of the voltage vs. current during the entire decay phase results in a characteristic trace which can be analyzed to obtain values for various plasma parameters. As will be appreciated by those practicing the concepts of the present disclosure, the plasma monitoring probe assembly may be configured to function as any of a variety of alternative probe types designed to measure a parameter of the plasma, which measurement may be indicative of a condition of the plasma, the plasma processing chamber, one or more components of the chamber, or the object subject to the plasma processing.

The electrically conductive probe 20 and the insulator sleeve assembly 30 are positioned in an operationally-graded E-field portion 40 of the plasma processing chamber (see FIG. 4). For the purposes of describing and defining the present invention, it is noted that the plasma processing chamber can be described as comprising an "operationally-graded E-field portion" where, during operation, a graded difference in electric potential accumulates between an electrically conductive probe of the plasma monitoring probe assembly and floating, grounded, or differentially-biased hardware of the plasma processing chamber. The difference is "graded" in the sense that the magnitude of the difference varies from relatively low magnitude E-field portions where the probe and surrounding hardware are relatively close to the operational plasma, to relatively high magnitude E-field portions where the probe and surrounding hardware are relatively distant from the operational plasma.

As is illustrated in FIG. 4, the operationally-graded E-field portion 40 of the plasma processing chamber 100 comprises one or more chamber components that are electrically isolated from the electrically conductive probe 20 by the insulator sleeve assembly 30. The insulator sleeve assembly 30 comprises a plasma-side sleeve portion 32 and a subterranean sleeve portion 34 positioned about distinct portions of a longitudinal probe axis 35 of the electrically conductive probe 20 of the probe assembly 10.

As is illustrated most clearly in FIGS. 3 and 4, the plasma-side sleeve portion 32 of the insulator sleeve assembly 30 is positioned along a portion of the longitudinal probe axis 35 that is closer to the plasma processing portion 120 of the plasma processing chamber 100 than is the subterranean sleeve portion 34 of the insulator sleeve assembly 30.

The present inventors have recognized that, in operation, various differences in electric potential can build-up between the various chamber components in the vicinity of the plasma monitoring probe assembly 10, creating an operationally-graded E-field portion 40 in the vicinity of the probe assembly 10. Components, like the ceramic coupling ring 182, that develop relatively high differences in electric potential relative to the conductive probe 20 of the probe assembly 10, will lie in the resulting E-field maximum of the operationally-graded E-field portion 40 and will be more subject to operational arc discharge than components, like the electrically conductive silicon edge ring 180, that merely develop relatively low differences in electric potential relative to the conductive probe 20. Noting that the subterranean sleeve portion 34 is positioned closer to the resulting E-field maximum than is the plasma-side sleeve portion 32, it is contemplated that potentially deleterious arcing can be avoided if the subterranean sleeve portion 34 is constructed of material that is more electrically resistant than the material of the plasma-side sleeve portion 32. Further, noting that the plasma-side sleeve portion 32 is positioned further from the resulting E-field maximum, it is contemplated that plasma damage can be mitigated by constructing the plasma-side sleeve portion 34 of material that is more resistant to plasma-based degradation than is the material of the subterranean sleeve portion 34.

For example, noting that ceramic materials are generally more resistant to plasma-side damage than glass materials, and that glass materials are generally better electrical insulators than ceramic materials, it is contemplated that the plasma-side sleeve portion 32 can be constructed primarily of a ceramic material, while the subterranean sleeve portion 34 can be constructed primarily of a glass material. Suitable ceramic materials can, for example, be selected from zirconia, SiC, alumina, $Y_2O_3$ and $YF_3$, or combinations thereof. Suitable glass materials can, for example, include quartz or can be replaced with relatively high resistivity SiC or another high resistivity dielectric insulator.

In the embodiment illustrated in FIGS. 3 and 4, the sensing surface 22 of the electrically conductive probe 20, which may comprise a silicon carbide pin, is surrounded by a portion of the electrically conductive silicon edge ring 180 and is spaced from the surrounding portion of the silicon edge ring 180 by the plasma-side sleeve portion 32 of the insulator sleeve assembly 30. An anchored portion 24 of the electrically conductive probe 20 is spaced from the electrically conductive base 174 by the subterranean sleeve portion 34 of the insulator sleeve assembly 30. As is illustrated, the plasma-side sleeve portion 32 and the subterranean sleeve portion 34 of the insulator sleeve assembly 30 may collectively occupy a substantial entirety of a length dimension of the insulator sleeve assembly 30 along the longitudinal probe axis 35. In which case, it is contemplated that the plasma-side sleeve portion 32 and the subterranean sleeve portion 34 of the insulator sleeve assembly 30 can be positioned in an end-to-end abutment along the longitudinal probe axis.

The electrically conductive probe 20 and the insulator sleeve assembly 30 may be concentrically spaced in the plasma-side sleeve portion 32 and in the subterranean sleeve portion 34 of the plasma monitoring probe assembly 10. To maintain concentric spacing, the plasma monitoring probe assembly 10 may be provided with an electrically conductive socket 26 that is configured to maintain the concentric spacing of the electrically conductive probe 20 and the insulator sleeve assembly 30.

It is also noted that recitations herein of "at least one" component, element, etc., should not be used to create an inference that the alternative use of the articles "a" or "an" should be limited to a single component, element, etc.

It is noted that recitations herein of a component of the present disclosure being "configured" in a particular way, to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A plasma processing system, comprising:
   a plasma processing chamber; and
   a probe assembly including:
     a conductive probe;
     an insulator sleeve assembly including a plasma-side sleeve portion and a subterranean sleeve portion,
     wherein the plasma-side sleeve portion and the subterranean sleeve portion have inner surfaces that are arranged immediately adjacent to the conductive probe and are positioned about distinct portions of a longitudinal axis of the conductive probe, wherein the conductive probe and the insulator sleeve assembly are positioned in an operationally-graded E-field portion of the plasma processing chamber, wherein the operationally-graded E-field portion of the plasma processing chamber comprises one or more chamber components that are electrically isolated from the conductive probe by the insulator sleeve assembly, wherein the subterranean sleeve portion of the insulator sleeve assembly is positioned along a portion of the longitudinal axis that is closer to an E-field maximum of the operationally-graded E-field portion of the plasma processing chamber than is the plasma-side sleeve portion of the insulator sleeve assembly;

wherein first ends of the plasma-side sleeve portion and the subterranean sleeve portion are arranged in an abutting relationship, and wherein an uppermost surface of the subterranean sleeve portion abuts a lowest surface of the plasma-side sleeve portion, wherein the plasma-side sleeve portion is made of ceramic material, the subterranean sleeve portion is a made of a quartz material that is different from the ceramic material, the quartz material has a higher electrical resistance than the ceramic material, and the ceramic material has a higher resistance to plasma-based degradation than the quartz material.

2. The plasma processing system of claim 1, wherein:
a second end of the plasma-side sleeve portion and a first end of the conductive probe are coplanar and exposed to plasma in the plasma processing chamber.

3. The plasma processing system of claim 1, wherein the plasma processing chamber comprises control hardware that is configured to control an electrical bias of the conductive probe relative to a grounded, floating, or biased component of the plasma processing chamber.

4. The plasma processing system of claim 1, wherein:
the plasma processing chamber comprises:
   a wafer processing stage including a wafer mounting portion; and
   a conductive silicon edge ring surrounding the wafer mounting portion of the wafer processing stage,
wherein the probe assembly is arranged in the conductive silicon edge ring.

5. The plasma processing system of claim 1, the plasma processing chamber comprises:
a wafer processing stage including a wafer mounting portion supported by a conductive base; and
a conductive silicon edge ring that is supported by an insulating ceramic coupling ring, wherein the silicon edge ring surrounds the wafer mounting portion of the wafer processing stage, and
wherein the probe assembly extends from the conductive base through the ceramic coupling ring and the conductive silicon edge ring.

6. The plasma processing system of claim 5, wherein:
a sensing surface of the conductive probe is surrounded by a surrounding portion of the conductive silicon edge ring and is spaced from the surrounding portion of the conductive silicon edge ring by the plasma-side sleeve portion of the insulator sleeve assembly; and
an anchored portion of the conductive probe is spaced from the conductive base by the subterranean sleeve portion of the insulator sleeve assembly.

7. The plasma processing system of claim 1, wherein the conductive probe and the insulator sleeve assembly are concentrically spaced in the plasma-side sleeve portion and the subterranean sleeve portion of the probe assembly.

8. The plasma processing system of claim 7, wherein the probe assembly further comprises a conductive socket that is configured to maintain the concentric spacing of the conductive probe and the insulator sleeve assembly.

9. The plasma processing system of claim 1, wherein the conductive probe comprises a silicon carbide pin.

10. The plasma processing system of claim 1, wherein the plasma processing chamber further comprises at least one of capacitively-coupled plasma generating hardware, inductively-coupled plasma generating hardware, or electron cyclotron resonance plasma generating hardware.

11. The plasma processing system of claim 1, wherein the plasma processing chamber further comprises:
   one or more process gas inlets;
   process gas sources coupled to the one or more process gas inlets; and
   one or more inert gas sources coupled to the one or more process gas inlets.

12. The plasma processing system of claim 1, wherein the ceramic material is selected from zirconia, SiC, alumina, $Y_2O_3$ and $YF_3$ or combinations thereof.

13. The plasma processing system of claim 1, wherein (i) the plasma-side sleeve portion is arranged within a conductive silicon edge ring surrounding a wafer mounting portion of the plasma processing system and (ii) the subterranean sleeve portion is arranged within a ceramic coupling ring below the conductive silicon edge ring.

* * * * *